(12) United States Patent
Mueller et al.

(10) Patent No.: US 8,398,766 B2
(45) Date of Patent: Mar. 19, 2013

(54) SEMICONDUCTOR WAFER COMPOSED OF MONOCRYSTALLINE SILICON AND METHOD FOR PRODUCING IT

(75) Inventors: Timo Mueller, Burghausen (DE);
Gudrun Kissinger, Lebus (DE); Walter Heuwieser, Neuoetting (DE); Martin Weber, Kastl (DE)

(73) Assignee: Siltronic AG, Munich (DE)

( * ) Notice: Subject to any disclaimer, the term of this patent is extended or adjusted under 35 U.S.C. 154(b) by 787 days.

(21) Appl. No.: 12/548,862

(22) Filed: Aug. 27, 2009

(65) Prior Publication Data
US 2010/0059861 A1    Mar. 11, 2010

(30) Foreign Application Priority Data

Sep. 10, 2008  (DE) .................... 10 2008 046 617

(51) Int. Cl.
*C30B 15/02*    (2006.01)
(52) U.S. Cl. ............... 117/13; 117/15; 117/14; 117/929
(58) Field of Classification Search .............. 117/13, 117/14, 15, 929
See application file for complete search history.

(56) References Cited

U.S. PATENT DOCUMENTS

| | | | |
|---|---|---|---|
| 5,980,720 A | 11/1999 | Park et al. | |
| 6,548,035 B1 | 4/2003 | Kimura et al. | |
| 7,033,962 B2 | 4/2006 | Takeno | |
| 7,189,293 B2 | 3/2007 | Kobayashi et al. | |
| 7,828,893 B2 | 11/2010 | Mueller et al. | |
| 7,875,115 B2 | 1/2011 | Nakai et al. | |
| 2003/0029375 A1 | 2/2003 | Watanabe et al. | |
| 2003/0175532 A1 | 9/2003 | Asayama et al. | |
| 2004/0192015 A1 | 9/2004 | Ammon et al. | |
| 2004/0194692 A1 | 10/2004 | Nishikawa et al. | |
| 2005/0039671 A1 | 2/2005 | Watanabe et al. | |
| 2005/0247259 A1 | 11/2005 | Yoon et al. | |
| 2006/0060129 A1* | 3/2006 | Hirano | 117/20 |
| 2006/0292890 A1 | 12/2006 | Ammon et al. | |

FOREIGN PATENT DOCUMENTS

| | | |
|---|---|---|
| DE | 102 36 023 A1 | 3/2003 |
| DE | 103 39 792 A1 | 10/2004 |
| EP | 1170404 A1 | 1/2002 |
| EP | 1 887 110 A1 | 2/2008 |
| JP | 2001139396 A | 5/2001 |
| JP | 2007070132 A | 3/2007 |
| JP | 2008100906 A | 5/2008 |

(Continued)

OTHER PUBLICATIONS

G. Kissinger et al., The Electrochem. Society: Proceedings vol. 97-22, 32-39 (1997) p. 117.
G. Kissinger et al., J. Mater. Res., vol. 8, No. 8 (1993), p. 1900).
A.D. Smirnov, V.V. Kalaev, "Development of Oxygen Transport Model in Czochralski Growth of Silicon Crystals", Journal of Crystal Growth, 2008; 310 (12), pp. 2970-2976.

*Primary Examiner* — Bob M Kunemund
(74) *Attorney, Agent, or Firm* — Brooks Kushman P.C.

(57) ABSTRACT

Semiconductor wafers composed of monocrystalline silicon and doped with nitrogen contain an OSF region and a $P_v$ region, wherein the OSF region extends from the center radially toward the edge of the wafer as far as the $P_v$ region; the wafer has an OSF density of less than 10 $cm^{-2}$, a BMD density in the bulk of at least $3.5 \times 10^8$ $cm^{-3}$, and a radial distribution of the BMD density with a fluctuation range $BMD_{max}/BMD_{min}$ of not more than 3. The wafers are produced by controlling initial nitrogen content and maintaining oxygen within a narrow window, followed by a heat treatment.

17 Claims, 9 Drawing Sheets

FOREIGN PATENT DOCUMENTS

| | | |
|---|---|---|
| TW | 200643234 | 3/1995 |
| TW | 200725742 | 12/1995 |
| WO | 01/27362 A1 | 4/2001 |
| WO | 03/009365 A1 | 1/2003 |

* cited by examiner

SEMICONDUCTOR WAFER COMPOSED OF MONOCRYSTALLINE SILICON AND METHOD FOR PRODUCING IT

CROSS-REFERENCE TO RELATED APPLICATIONS

This application claims priority to German application DE 10 2008 046617.4 filed Sep. 10, 2008, which is herein incorporated by reference.

BACKGROUND OF THE INVENTION

1. Field of the Invention

The invention relates to a semiconductor wafer composed of monocrystalline silicon which has good gettering properties and is substantially free from defects in a region relevant to the integration of electronic devices. The invention also relates to an economical method for producing such semiconductor wafers.

2. Background Art

Two central requirements are made of a high-performance semiconductor wafer composed of monocrystalline silicon with regard to the defect distribution. Thus, the region of the semiconductor wafer into which the electronic devices are integrated must be as free as possible from defect types having a size in the range of the size of the structure widths of the electronic components or larger. These defect types include, in particular, COPs ("crystal originated particles"), provided that they attain the corresponding size, BMDs ("bulk micro defects"), OSFs (oxidation induced stacking faults) and OSF nuclei (nuclei for oxidation induced stacking faults). COPs are accumulations of vacancies that form voids in the nanometer range. COPs having a disturbing size can be detected for example as "Direct Surface Oxide Defects" (DSOD) with the aid of a preparation method described in U.S. Pat. No. 5,980,720, or else by means of laser scattered light topography, the results of which correlate well with those of DSOD detection. In particular, a laser scanner of the type MO-6 from the manufacturer Mitsui Mining and Smelting, Japan is suitable for automatically detecting COPs having a diameter of approximately 40 nm or larger (COP test). Furthermore, larger COPs can also be detected as "flow pattern defects" (FPD) by means of Secco etch and optical inspection. BMDs are precipitates of supersaturated oxygen which grow from smaller nuclei as a result of a thermal treatment ("anneal") of the semiconductor wafer. The diameter of the nuclei is typically approximately 1 nm. BMDs are detected for example by IR-LST ("infrared laser scattering tomography"), with confocal imaging in the infrared by SIRM ("scanning infrared spectroscopy") or, after enlargement (defect etching) for example with the aid of a chromium-containing etching solution, by optical microscopy. BMDs must have an average diameter of approximately 70 nm in order to be able to be detected with SIRM or by defect etching and subsequent microscopy. BMDs starting from a size of approximately 20 nm can be detected directly by IR-LST, for example with the aid of a BMD counter of the type MO-4 from Mitsui Mining and Smelting Co. Ltd., Japan. For detection by means of SIRM or by means of defect etching in combination with microscopy, the majority of the BMD size distribution can be raised above the detection limit by allowing the BMD nuclei to grow at a temperature of typically 1000° C. for 16 hours (BMD-Anneal).

OSFs are silicon stacking faults that can arise if relatively large oxygen precipitates acting as nuclei (OSF nuclei), the diameter of which typically lies within the range of 10 to 35 nm, grow as a result of oxygen accumulation after a surface oxidation in a moist or dry atmosphere at temperatures of around approximately 1050-1100° C. for a number of hours. OSF nuclei arise during the cooling of a silicon single crystal pulled from a melt, in regions which have an excess of vacancies despite COP formation. The formation of OSF nuclei can be intensified by the presence of nitrogen and by slower cooling of the single crystal.

The region of the semiconductor wafer that is relevant to electronic components should contain a minimum of OSF nuclei since OSFs are responsible for gate oxide breakdowns. Furthermore, even OSF nuclei can cause thin gate oxides having a thickness of not more than 7 nm to undergo breakdown. The breakdown strength of test capacitors in a GOI ("gate oxide integrity") test is therefore a reliable indicator of the detection of OSFs and OSF nuclei.

Outside the region of the semiconductor wafer that is relevant to components, that is to say in the bulk of the semiconductor wafer, the requirement is for a maximum density of BMDs. They form anchoring sites, so-called intrinsic getters, for metallic impurities and in this way reduce the concentration thereof in the region relevant to components. The size of the BMDs used as getters must not fall below a critical size because small BMDs are not thermally stable and are eliminated in the course of thermal treatments of the semiconductor wafer that are performed during the production of electronic components. A minimum size and minimum density of said BMDs are required in order to ensure a sufficient getter capacity, in particular for nickel and copper (K. Sueoka et al., The Electrochem. Soc. PV 2000-17, (2000), p. 164).

EP1170404 A1 describes a semiconductor wafer composed of monocrystalline silicon and a method for producing it. The semiconductor wafer has a high and radially rather homogeneous BMD density in the bulk and therefore good gettering properties. The latter are essentially ensured by two measures. Firstly, the single crystal that yields the semiconductor wafer is doped with nitrogen since the presence of nitrogen promotes oxygen precipitation and the formation of thermally stable oxygen precipitates. Secondly, use is made of the fact that a comparatively high number of free vacancies are available in the so-called Pv region, which is referred to as the NV region in EP1170404 A1. Like nitrogen, free vacancies are involved in the formation of oxygen precipitates.

It is generally recognized that the ratio of pulling rate V and axial temperature gradient G at the phase boundary V/G during the process of pulling a silicon single crystal, is the essential parameter which can be used to control the formation of intrinsic point defects, that is to say vacancies and silicon interstitials, and the agglomerations thereof. The greater V/G is in comparison with a critical value, the more pronounced is the excess of vacancies that pass into the growing single crystal. The smaller V/G is in comparison with the critical value, the more pronounced is the excess of silicon interstitials which pass into the growing single crystal. If the point defects attain supersaturation during the cooling of the single crystal, they form agglomerates which, in the case of the vacancies, are the cause of the production of COPs. The $P_v$ region arises if V/G is controlled during the process of pulling the single crystal in such a way that the quotient is greater than the critical value and less than a V/G for which a region forms in which OSF nuclei preferably arise (OSF region). There is a high density of agglomerates of vacancies in the $P_v$ region. However, the average diameter of these agglomerates is so small that they are no longer detected by a COP test. However, they can be detected after decoration with copper (decoration test) or with the aid of IR-LST. A suitable preparation method for detection by means of IR-LST is described for example in G. Kissinger, G. Morgenstern, H. Richter, J. Vanhellemont, D. Gräf, U. Lambert, W. v. Ammon, P. Wagner, The Electrochem. Society: Proceedings Vol. 97-22, 32-39 (1997) page 117. The decoration test can be performed for example as follows: On the rear side of the semiconductor wafer to be examined, or of a piece thereof, copper is deposited electrolytically from an HF-containing (10 ml/l HF) aqueous $CuSO_4$ solution (20 g/l $CuSO_4$) (G. Kissinger, G. Morgenstern, H. Richter, J. Mater. Res., Vol. 8, No. 8 (1993), p. 1900). Afterward, the sample is subjected to thermal treatment at a temperature within the range of 900-1000° C. for 5-20 minutes, and is finally subjected to a lustre etch ($HNO_3$: HF=5:1) for 10 to 30 minutes. This is followed finally by a treatment with a Secco etching solution for 30 minutes, after which the defects become visible.

The range of permissible pulling rates, knowledge of which is necessary for controlling the quotient V/G in an intended manner, is usually defined by means of one or more preliminary experiments in which a single crystal is pulled at a varying pulling rate and is subsequently analyzed. For this purpose, the single crystal is cut open lengthwise and the cut surfaces are examined with regard to point defects and the accumulations thereof.

According to the description in EP1170404 A1, even those semiconductor wafers which consist entirely of an OSF region, or those which have an OSF ring surrounded by $P_v$ region on the inside and outside, have good gettering properties. No account is taken of the fact that measures for avoiding harmful OSF nuclei have to be taken as soon as the OSF region is included, and that difficulties as a result of COP formation are virtually unavoidable as soon as a vacancy-rich region is present inside an OSF ring.

A further requirement imposed on the manufacturers of high-performance semiconductor wafers composed of monocrystalline silicon is the ability to economically produce these semiconductor wafers in the highest possible numbers. It is urgently necessary, therefore, for the production method to provide a high yield. However, many difficulties have to be overcome in this regard. One problem, which is also addressed by the present invention, is that the concentration of nitrogen in the single crystal rises owing to the small segregation coefficient of nitrogen depending on the length of the single crystal. In the case of semiconductor wafers which originate from the end portion of the single crystal processed to form semiconductor wafers, the comparatively high concentration of nitrogen can have the effect that they have an excessively high number of OSF nuclei since nitrogen promotes the oxygen precipitation necessary for the nucleation. However, the number of OSF nuclei is not only dependent on the concentration of nitrogen, since semiconductor wafers which originate from the front part of the single crystal section processed to form semiconductor wafers can also have an excessively high number of OSF nuclei.

SUMMARY OF THE INVENTION

Therefore, an object of the present invention was to provide a semiconductor wafer composed of monocrystalline silicon which has good gettering properties and is substantially free of defects, in particular with regard to OSFs and OSF nuclei, in a region relevant to the integration of electronic devices. Furthermore, the object of the present invention was to specify a very economical method which can supply such semiconductor wafers in a high yield. These and other objects are achieved by growing a single crystal by the CZ method under conditions of V and G such that the crystal contains both a $P_v$ region and an OSF region and doping with oxygen and nitrogen are controlled during the growth process, wafers are sawn from the single crystal, and subjected to a specific heat treatment at elevated temperature. The wafers have a high and uniform BMD distribution, and an OSF region extending radially outward from the center of the wafer, with a low OSF density.

DETAILED DESCRIPTION OF THE PREFERRED EMBODIMENT(S)

Figure 1:
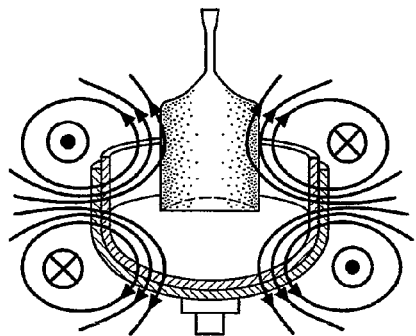
FIG. 1 illustrates a CUSP field useful for use in the invention.

The invention is thus directed to a semiconductor wafer composed of monocrystalline silicon, the wafer being doped with nitrogen, and furthermore comprising: an OSF region and a $P_v$ region, wherein the OSF region extends from the center of the semiconductor wafer in the direction toward the edge of the semiconductor wafer as far as the $P_v$ region; a BMD density in the bulk of at least $3.5 \times 10^8$ cm$^{-3}$; a radial distribution of the BMD density with a fluctuation range expressed by the quotient $BMD_{max}/BMD_{min}$ of not more than 3, where $BMD_{max}$ and $BMD_{min}$ represent the maximum and minimum BMD density, respectively; and an OSF density of less than 10 cm$^{-2}$.

The invention is furthermore directed to a method for producing semiconductor wafers composed of monocrystalline silicon, comprising: pulling a single crystal from a melt in accordance with the CZ method, and during the process of pulling the single crystal, controlling the quotient V/G of the pulling rate V and the axial temperature gradient G at the phase boundary in such a way that an OSF region and a $P_v$ region are formed in a section of the single crystal that is provided for the production of semiconductor wafers, wherein the OSF region extends from the center of the single crystal in the direction toward the periphery of the single crystal as far as the $P_v$ region; during the pulling process, doping the single crystal with nitrogen in such a way that the nitrogen concentration in the front part of the section of the single crystal that is provided for the production of semiconductor wafers is $3 \times 10^{13}$ to $6 \times 10^{13}$ atoms/cm$^3$; during the pulling process, controlling the oxygen concentration in such a way that the oxygen concentration in the section that is provided for the production of semiconductor wafers is 4.4 to $5.2 \times 10^{17}$ atoms/cm$^3$; slicing semiconductor wafers composed of monocrystalline silicon from the single crystal; loading the semiconductor wafers composed of monocrystalline silicon into a furnace at a loading temperature of 500 to 750° C.; increasing the temperature of the semiconductor wafers composed of monocrystalline silicon from the loading temperature to a holding temperature at a rate of increase which is at least 3.5° C./min in a temperature range from the loading temperature to 1000° C. and which is less than 3.5° C./min in a temperature range from 1000° C. up to the holding temperature; and heat treatment of the semiconductor wafers composed of monocrystalline silicon at the holding temperature, which lies in the range of 1075° C. to 1100° C.

A semiconductor wafer according to the invention fulfills all important requirements. It has a region near the surface ("denuded zone") which affords the best preconditions for the integration of electronic devices since it is substantially free of defects. The region near the surface contains no BMDs and no COPs having a disturbing size, and only a small number of OSF nuclei. The OSF density is less than 10 cm$^{-2}$ after a standard oxidation in oxygen and an inspection using an optical microscope (OSF test). In the bulk, the semiconductor wafer has a BMD density of at least $3.5 \times 10^8$ cm$^{-3}$, preferably at least $7 \times 10^8$ cm$^{-3}$, wherein the radial fluctuation range BMD$_{max}$/BMD$_{min}$ is not more than a factor of 3, preferably taking account of an edge exclusion of 2 mm.

In order to obtain a semiconductor wafer having these properties a method is required which appropriately takes account of the crucial influencing variables on defect formation. The method according to the invention accomplishes this and is moreover very economical because it supplies the semiconductor wafer in high yields and because the outlay on thermal energy ("thermal budget") during the thermal treatment of the semiconductor wafer, which is part of the method, is comparatively low.

During the process of pulling the single crystal, the V/G quotient is controlled in such a way that in the center of the single crystal an OSF region arises which extends from the center of the single crystal in the direction toward the periphery of the single crystal. The OSF region is therefore formed in disk-shaped fashion rather than in ring-shaped fashion with a region in the center of the ring in which no OSF nuclei are found. The magnitude of the V/G quotient is limited in the center of the single crystal such that no disturbing COPs are formed. Furthermore, V/G is controlled in such a way that although the quotient decreases in the radial course and will leave the OSF region, the quotient remains larger than would be necessary for forming a region having an excess of silicon interstitials. Therefore, the disk-shaped OSF region is adjoined by a P$_v$ region that extends toward the periphery of the single crystal. The excess of vacancies in the OSF region and P$_v$ region promotes the formation of a high number of gettering oxygen precipitates in the bulk of a semiconductor wafer produced from the single crystal. Such a semiconductor wafer correspondingly has an OSF region which extends from the center of the semiconductor wafer in the direction toward the edge of the semiconductor wafer and adjoins a P$_v$ region which reaches from the OSF region as far as the edge of the semiconductor wafer.

The incorporation of oxygen and nitrogen into the single crystal likewise has to be carefully controlled. Oxygen is necessary for the formation of BMDs and nitrogen has an assisting effect in this case. However, both elements also promote the formation of OSF nuclei. In the case of the nitrogen, therefore, care should be taken to ensure that the single crystal is doped with nitrogen during the pulling process in such a way that the nitrogen concentration in the front part of the section of the single crystal that is provided for the production of semiconductor wafers is $3 \times 10^{13}$ to $6 \times 10^{13}$ atoms/cm$^3$. This ensures that the nitrogen concentration in the tail portion of the section still remains sufficiently low if the concentration, owing to segregation, rises to values of up to $2.5 \times 10^{14}$ atoms/cm$^3$. The single crystal section provided for the production of semiconductor wafers is the cylindrical section lying between conical sections and having the nominal diameter of the single crystal. One possibility for doping the melt with nitrogen consists, for example, in gassing said melt with a defined volume of a nitrogen-containing gas, such as NH$_3$, before the process of pulling the single crystal. The required quantity of nitrogen can also be provided in the form of a silicon wafer which is coated with a corresponding quantity of nitride and which is concomitantly melted during the production of the melt.

In the case of the oxygen, care should be taken to ensure that during the process of pulling the single crystal, the section of the single crystal that is provided for the production of semiconductor wafers takes up not less than $4.4 \times 10^{17}$ atoms/cm$^3$ and not more than $5.2 \times 10^{17}$ atoms/cm$^3$ (according to new ASTM). In this way, the nitrogen and oxygen concentrations are optimally coordinated with one another with regard to the capability of forming a sufficient number of BMDs and avoiding OSFs.

Figure 2:
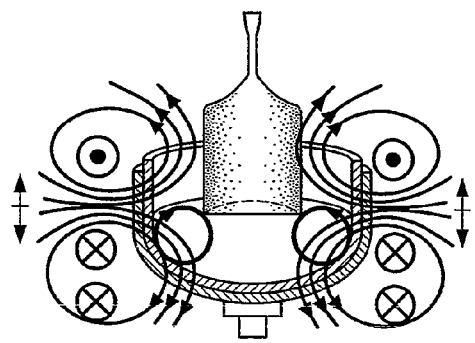
FIG. 2 illustrates a TMF useful for use in the invention.

The careful control of the incorporation of oxygen into the single crystal is also accorded a particular importance with regard to the economic viability of the method. In the initial phase of pulling the single crystal, when the crucible is filled with the melt, the melt dissolves a comparatively large quantity of oxygen from the crucible material. Therefore, there is the risk of more oxygen than intended passing into the single crystal at this point in time. In order to limit the incorporation of oxygen into a single crystal, a magnetic field is often impressed on the melt. In accordance with DE 103 39 792 A1, in particular CUSP magnetic fields and travelling magnetic fields (TMF) are suitable for this purpose. Suitable coil arrangements for generating such fields are illustrated in FIG. 1 (CUSP magnetic field) and FIG. 2 (TMF). With the aid of travelling magnetic fields it is possible to generate in the melt a convection vortex that maintains a melt flow that conveys oxygen in the form of SiO out of the melt into the surrounding gas space via the crucible. In the vortex, the melt flows along the crucible wall to the surface of the melt, and from there radially inward, and turns off in the direction of the bottom of the crucible after a distance corresponding approximately to half the radius of the crucible. CUSP fields have a damping effect on the melt flow and thereby reduce the incorporation of oxygen into the single crystal. Since the crucible is raised in the course of pulling the single crystal, in order to maintain the position of the surface of the melt, the magnetic flux density in the melt decreases in the end phase of the process of pulling the single crystal, and with it the oxygen-reducing effect of the magnetic field.

In accordance with the preferred embodiment of the method according to the invention, one or more measures are taken during the process of pulling the single crystal in order to have the effect that the oxygen concentration, at least in the section provided for the production of semiconductor wafers, remains in the range of $4.4 \times 10^{17}$ atoms/cm$^3$ to $5.2 \times 10^{17}$ atoms/cm$^3$. A first measure, which takes effect in particular in the initial phase of pulling the single crystal, consists of lengthening the thermally insulating heat shield usually used, the heat shield surrounding the single crystal, by a gas guide tube which is widened to form a ring at a lower end, wherein the ring lies opposite the surface of the melt. The height of the gap between the ring and the surface is preferably not more than 20 mm and not less than 10 mm. In the gap, purge gas, for example argon, which is directed to the surface of the melt is guided close to the surface and accelerated. The accelerated purge gas flow provides for efficient removal of SiO that escapes from the melt, and thus also for a reduced incorporation of oxygen into the single crystal. In contrast to the heat shield, the gas guide tube is embodied with good thermal conductivity in order that its thermal influence on the single crystal and thus on the V/G ratio remains insignificant. The gas guide tube is preferably composed of a non-contaminating metallic material such as molybdenum. The oxygen-reducing effect of the gas guide tube can also be reinforced by increasing the pressure of the purge gas or the volumetric flow rate of the purge gas, or both. A pressure of 1 to 4 kPa and a volumetric flow rate of 2300 to 3200 l/h are particularly preferred.

A further measure, which is effective particularly in the end phase of pulling the single crystal, consists of increasing the field strength of the CUSP magnetic field and/or raising the magnet coils in order to maintain the magnetic flux density in the melt and with it the oxygen-reducing effect of the magnetic field. By increasing the magnetomotive force, that is to say the product of the current intensity I and the number N of turns, for example by 20% from, for example, 60,000 ampere-turns, it is possible to reduce the oxygen concentration in the single crystal by approximately $0.7 \times 10^{17}$ atoms/cm$^3$. The associated increase in the electrical power, just like raising the magnet coils, involves a comparatively high outlay. Involving a lower outlay and therefore preferred is a method in which firstly a CUSP magnetic field is impressed on the melt during the process of pulling the single crystal. Later, when the rear part of the single crystal section to be processed to form semiconductor wafers is to be pulled, a magnetic field comprising the combination of a CUSP magnetic field and a travelling magnetic field directed upward is impressed on the melt. The magnetomotive force is preferably from 53,000 to 60,000, more preferably 57,600, ampere-turns for an upper CUSP coil and preferably from 95,000 to 105,000, more preferably 100,800, ampere-turns for a lower CUSP coil. The field strength of the TMF is preferably set such that the coils alternately generate a magnetomotive force having a real component in the range of from 3600 ampere-turns to −2400 ampere-turns. The frequency of the TMF is preferably 50 to 75 Hz. The combined magnetic field maintains the convection vortex which accelerates the escape of SiO from the melt.

As a result, carrying out at least one of the measures described above for controlling the oxygen concentration in the single crystal has the effect that the yield of semiconductor wafers whose oxygen concentration lies within the required range of $4.4 \times 5.2 \times 10^{17}$ atoms/cm$^3$ is at least 90%, relative to the cylindrical section of the single crystal. If these measures are dispensed with, by contrast, the yield is at least 35% lower.

The semiconductor wafers are sliced from the single crystal and prepared for the thermal treatment according to the invention. Preparation includes mechanical and chemical processing that convert the semiconductor wafers into a polished state.

The thermal treatment is coordinated with the properties of the semiconductor wafers. It provides a "denuded zone" having a sufficient depth in which BMDs are absent and OSF nuclei are almost completely eliminated, and produces a region in the bulk of the semiconductor wafers having a high density of stable BMDs and having a homogeneous radial distribution of the BMDs. The thermal treatment is also distinguished by an economic "thermal budget", which is achieved in particular by means of a comparatively short duration and a comparatively low holding temperature. It is preferably carried out in a furnace in which a plurality of the semiconductor wafers are subjected to heat treatment simultaneously, and takes place in an inert or reducing atmosphere. A preferred reducing atmosphere contains hydrogen. A reducing atmosphere can also contain inert constituents besides one or a plurality of reducing gases. An inert atmosphere comprises exclusively constituents which do not react with the surface of the semiconductor wafers under the conditions of the thermal treatment. By way of example, inert gases such as nitrogen or noble gases can be used, wherein noble gases are preferred and argon is particularly preferred.

The loading temperature is 500 to 750° C. The thermal treatment would be prolonged unnecessarily with a lower loading temperature, and oxygen nuclei necessary for achieving the required BMD density would be eliminated with a higher loading temperature. In order to arrive at the holding temperature within the range of 1075° C. to 1100° C., preferably within the range of 1075° C. to 1090° C., the temperature is increased from the loading temperature up to a temperature of 1000° C. at a rate of increase which amounts to at least 3.5° C./min. Rates of increase of 5° C./min up to a temperature of 900° C. and of 3.5° C./min up to the temperature of 1000° C., or of 10° C./min up to a temperature of 800° C., of 5° C./min up to a temperature of 900° C. and of 3.5° C./min up to the temperature of 1000° C., are particularly preferred. In the temperature range from 1000° C. up to the holding temperature, the rate of increase is less than 3.5° C./min. A rate of increase of 2° C./min up to a temperature of 1050° C. and of 1° C./min up to the holding temperature is particularly preferred. The gradient of the temperature profile from the loading temperature up to the holding temperature in a temperature/time diagram is preferably always positive. The duration of the thermal treatment at the holding temperature is preferably not shorter than 45 min and not longer than 180 min. The depth of the "denuded zone" can be well controlled by way of the magnitude of the holding temperature and the duration of the thermal treatment at the holding temperature. It is preferably 5 to 30 μm.

After the thermal treatment, the semiconductor wafers are cooled as rapidly as possible and unloaded from the furnace. In order to avoid slips owing to thermal stress, it is advantageous to slowly increase the cooling rates. What are particularly preferred are cooling rates of not more than 1° C./min down to a temperature of 1050° C., of not more than 2° C./min down to a temperature of 1000° C., of not more than 3.5° C./min down to a temperature of 900° C., of not more than 5° C./min down to a temperature of 800° C. and of 5 to 10° C./min down to the unloading temperature, which is preferably in the region of the loading temperature.

Results of the invention implemented practically on the basis of a preferred exemplary embodiment are presented below and explained with the aid of figures.

Figure 3:
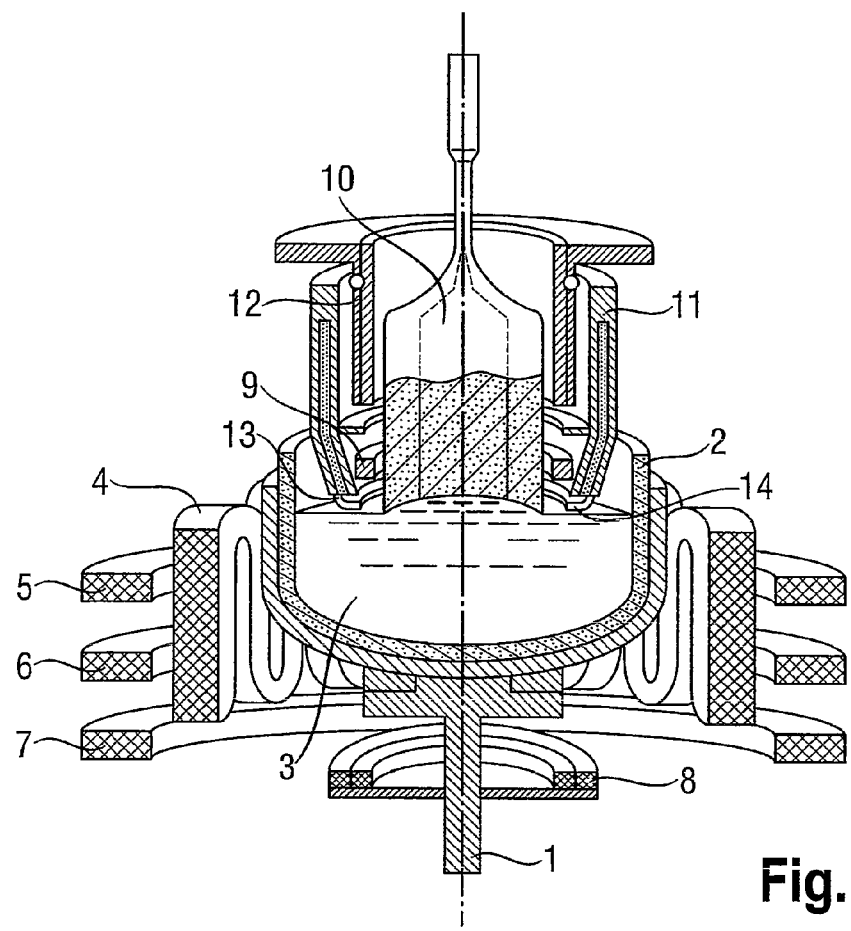
FIG. 3 illustrates one embodiment of a CZ furnace useful in the process of the invention.
Figure 4:
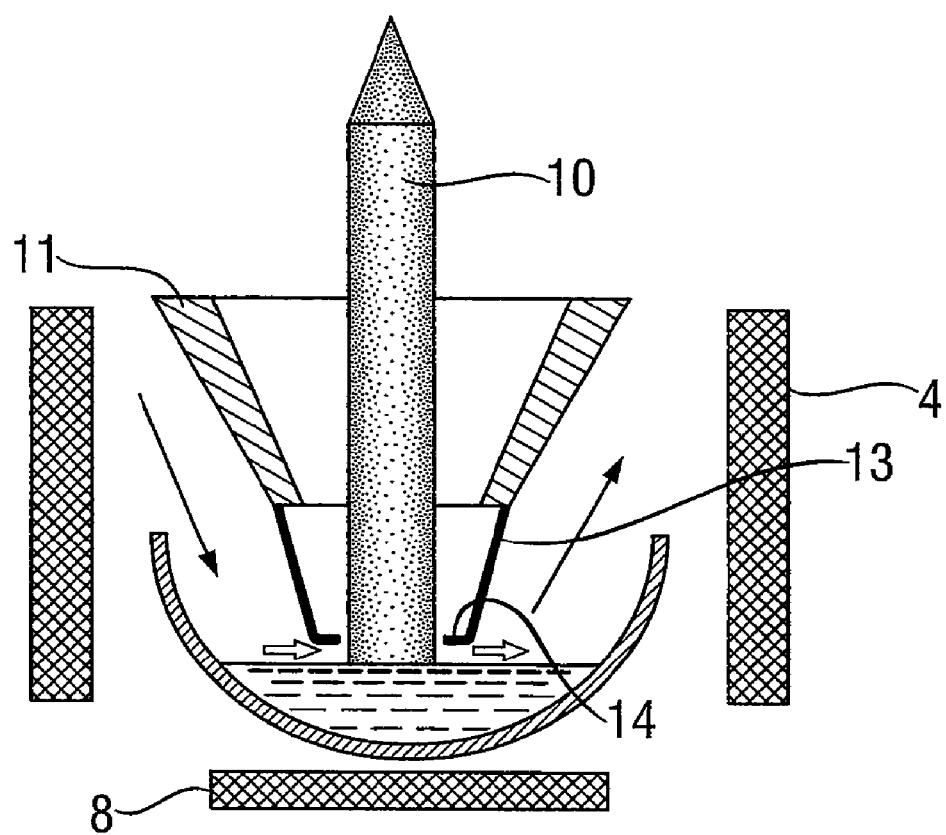
FIG. 4 illustrates the as guide tube and ring in enlarged fashion.

Silicon single crystals having a nominal diameter of 300 mm were pulled in accordance with the method according to the invention using an apparatus whose configuration that determines the heat transport ("hot zone") is illustrated schematically in FIG. 3. Elementary constituent parts of this configuration are a supported crucible 2 resting on a rotatable and liftable crucible shaft 1 and having a silicon melt 3 contained therein. Situated around the crucible are a resistance heater 4, as lateral heater for melting polycrystalline silicon and for supplying heat to the melt from the side, and three magnet coils 5, 6, 7 of a magnetic device for generating a magnetic field that influences the melt convection. Arranged below the crucible is a resistance heater 8, as bottom heater for supplying heat to the melt from below. A further heating element 9 is situated just above the melt 3, as ring heater for lowering the axial temperature gradient G in the edge region of the phase boundary between the single crystal 10 pulled from the melt and the melt 3. A thermally insulating heat shield 11 and a cooling jacket 12 are arranged around the single crystal. A special constituent part of the configuration is a gas guide tube 13 composed of molybdenum, which is fixed to the heat shield and widened at its lower end to form a ring 14. The gap between the surface of the melt and the lower side of the ring is preferably 10-20 mm, 20 mm in the exemplary embodiment. FIG. 4 illustrates the gas guide tube 13 and the ring 14 in enlarged fashion. The arrows designate the flow direction of the purge gas and the acceleration of the gas flow in the gap between the surface of the melt and the lower side of the ring.

In preliminary experiments with the "hot zone" chosen, the range of permissible pulling rates was established within which the quotient V/G had to be controlled in order to be able to pull a cylindrical section having the desired properties with regard to the distribution of intrinsic point defects and the accumulations thereof.

In order to determine the influence of the gas guide tube on the oxygen concentration $[O_i]$ in the single crystal, single crystals were pulled with and without the support of the gas guide tube under otherwise identical conditions and the oxygen concentrations at the beginning of the cylindrical section of the single crystal were compared. The results of these experiments are compiled in Table 1. They show that the gas guide tube was necessary when pulling the start of the cylindrical section, in order to control the oxygen concentration in such a way that it lay within the desired range of 4.4 to $5.2 \times 10^{17}$ atoms/cm$^3$.

TABLE 1

| | $[O_i]$/4.4 to $5.2 \times 10^{17}$ atoms/cm$^3$ | | | |
|---|---|---|---|---|
| Axial position | 1 mm | 100 mm | 300 mm | 400 mm |
| With gas guide tube | Appropriate | Appropriate | Appropriate | Appropriate |
| Without gas guide tube | Too high | Too high | Too high | Appropriate |

In order to determine the influence of the magnetic field on the oxygen concentration in the single crystal, single crystals were pulled, under otherwise identical conditions, in one instance with and in one instance without amplification of the CUSP magnetic field by increasing the electrical power expended for generating the CUSP magnetic field by 20% and in one instance with a change to a combined CUSP magnetic field/TMF at the start of pulling the last third of the cylindrical section. Until the change to the combined CUSP magnetic field/TMF, a CUSP magnetic field was generated by the two outer magnet coils 5, 7. No electric current was sent through the middle coil 6. After the change, the CUSP field was still generated by the topmost and the bottommost coil 5, 7 (with a magnetomotive force of 57,600 and 100,800 ampere-turns, respectively). In addition, three-phase current was applied to all three magnet coils 5, 6, 7 in order to simultaneously generate the travelling magnetic field. The magnet coils were connected up in such a way that they impressed on the melt an upwardly directed travelling magnetic field having a frequency of 50 Hz in addition to the CUSP magnetic field. The coils alternately generated the magnetomotive force having a real component of 3000 to −1500 ampere-turns. The results of these experiments are compiled in Table 2. They show that when pulling the rear part of the cylindrical section, it is necessary to alter the magnetic field impressed on the melt, in order to control the oxygen concentration in such a way that it lies within the desired range of 4.4 to $5.2 \times 10^{17}$ atoms/cm$^3$.

TABLE 2

| | $[O_i]$/4.4 to $5.2 \times 10^{17}$ atoms/cm$^3$ | | | |
|---|---|---|---|---|
| Axial position | 900 mm | 1100 mm | 1300 mm | 1400 mm |
| With combined CUSP magnetic field/TMF | Appropriate | Appropriate | Appropriate | Appropriate |
| With amplification of the CUSP magnetic field | Appropriate | Appropriate | Appropriate | Appropriate |
| Without amplification of the CUSP magnetic field | Appropriate | Too high | Too high | Too high |

Figure 5:
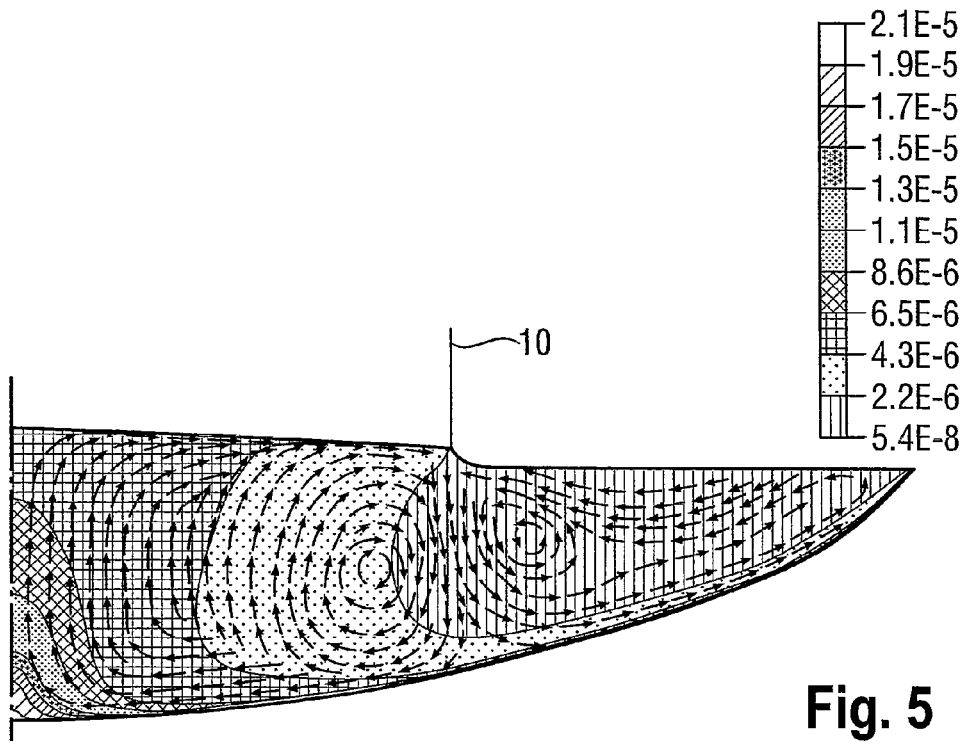
FIGS. 5 and 6 illustrate oxygen concentrations in the melt which can be achieved by a CUSP field alone (FIG. 5) and a combination of CUSP and TMF (FIG. 6)
Figure 6:
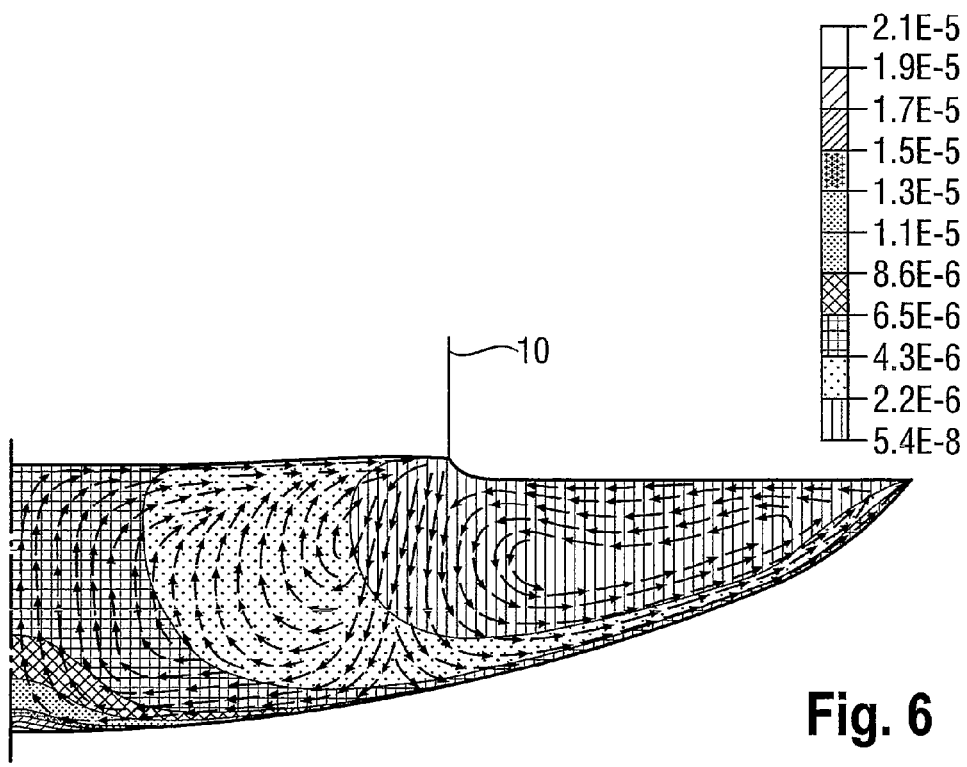

These results are consistent with the data from a simulation calculation that was used to determine the oxygen concentration in the melt. The oxygen transport model employed was taken from: A. D. Smirnov, V. V. Kalaev, "Development of oxygen transport model in Czochralski growth of silicon crystals", Journal of Crystal Growth, 2008; 310 (12), pp. 2970-2976. FIGS. 5 and 6 show the significant reduction of the oxygen concentration in the melt that is established if, instead of simply a CUSP field (FIG. 5), a combination of CUSP magnetic field and TMF (FIG. 6) is impressed on the melt. The oxygen concentrations are indicated in arbitrarily standardized units.

Figure 7:
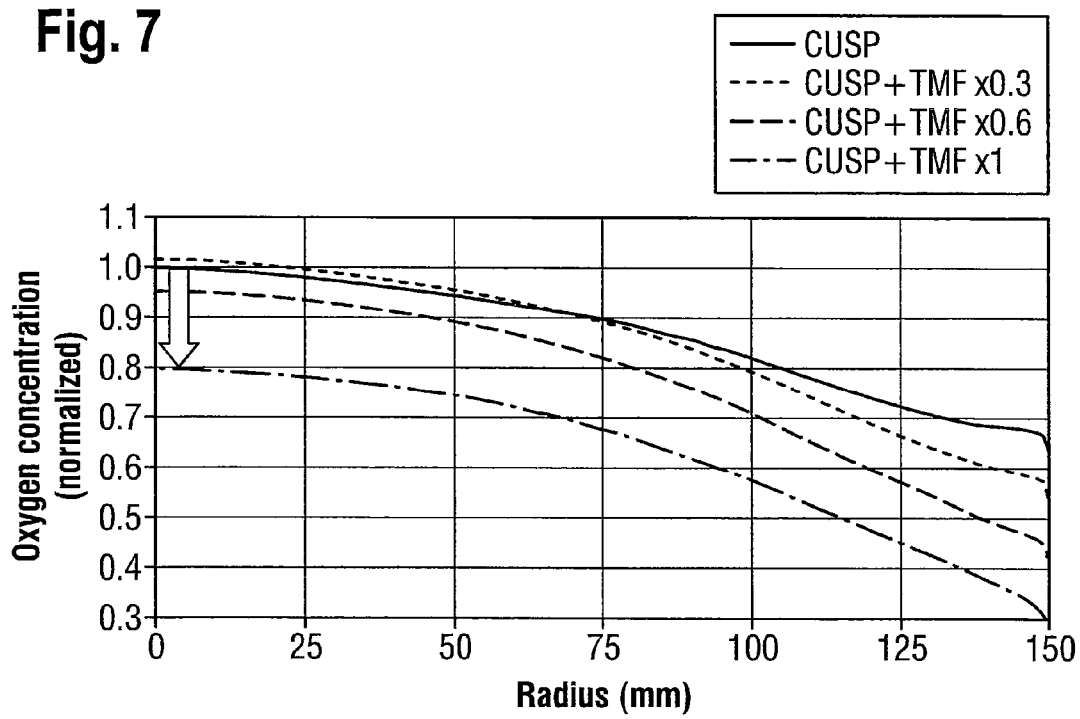
FIG. 7 illustrates the change in radial profile of oxygen in various magnetic fields.

FIG. 7 shows the reduction of the radial profile of the oxygen concentration in the single crystal depending on the relative strength of the TMF.

Taking account of the insights gained, using the "hot zone" described, a single crystal was pulled and doped with the necessary quantity of nitrogen in order that the nitrogen concentration in the front part of the cylindrical section was $3 \times 10^{13}$ atoms/cm$^3$. Furthermore, incorporation of oxygen into the single crystal was limited to a concentration within the range of 4.4 to $5.2 \times 10^{17}$ atoms/cm$^3$ by combining CUSP field and TMF when pulling the last 20% of the cylindrical section of the single crystal. Moreover, a profile of the pulling rate within the previously established range of permissible pulling rates was chosen. The cylindrical section was processed to form polished semiconductor wafers.

Figure 8:
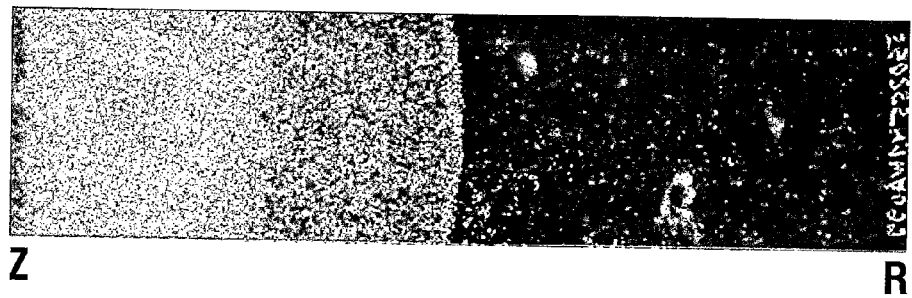
FIG. 8 is a photograph of a copper decorated wafer of the present invention showing the OSF disk and $P_v$ ring.
Figure 9:
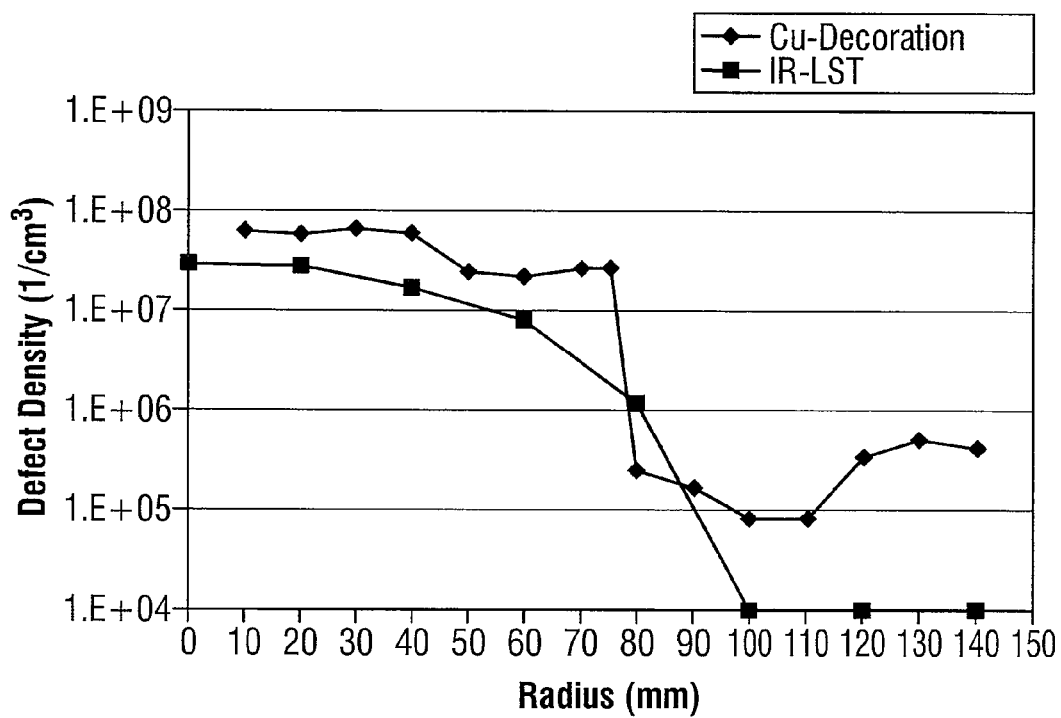
FIG. 9 is the radial defect density measured by two different methods on the wafer of FIG. 8.
Figure 10:
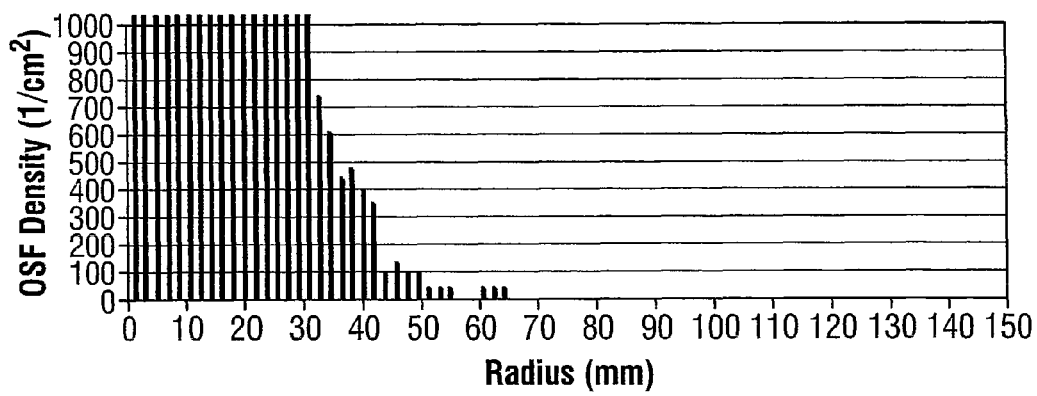
FIG. 10 is the OSF density of the wafer of FIG. 8.

One portion of these semiconductor wafers was examined in relation to its properties with regard to point defects and the accumulations thereof. Following etching with Secco solution, no FPDs could be detected. An examination by means of MO-6 likewise revealed the absence of any region having relatively large COPs. The results of a decoration test with copper, an IR-LST measurement using a BMD counter of the MO-4 type and an OSF test are illustrated in FIGS. 8 to 10. The tested semiconductor wafers exhibited a disk-shaped region in the center region having a particularly high density of accumulations of defects, which extends from the center Z with a range of approximately 30-50% of the radius of the semiconductor wafer in the direction toward the edge R of the semiconductor wafer, and an adjacent region having a significantly lower defect density, which reaches as far as the wafer edge. The OSF test indicated a high density of OSFs in the center region, while no OSFs were found in the adjacent outer region (FIG. 10). Such an analysis result is typical of a semiconductor wafer having a disk-shaped OSF region in the center and a $P_v$ region which adjoins the latter and reaches as far as the wafer edge.

Another portion of the semiconductor wafers, separated into three groups, was subjected to a thermal treatment according to the invention. Rates of increase and temperature ranges are compiled in Table 3. A different temperature profile (Ramps I, II and III) was chosen for each group.

TABLE 3

|  | Ramp I | Ramp II | Ramp III |
|---|---|---|---|
| Loading temperature | 500° C. | 500° C. | 500° C. |
| Temperature increase up to 800° C. | — | 10° C./min | — |
| Temperature increase up to 900° C. | 5° C./min | 5° C./min | 5° C./min |
| Temperature increase up to 1000° C. | 3.5° C./min | 3.5° C./min | 3/5° C./min |
| Temperature increase up to 1050° C. | 2° C./min | 2° C./min | 2° C./min |
| Temperature increase up to 1075° C. | 1° C./min | 1° C./min | 1° C./min |
| Temperature increase up to 1100° C. | — | — | 1° C./min |
| Holding temperature/ holding duration | 1075° C./120 min | 1075° C./120 min | 1100° C./120 min |

The temperature control during the process of cooling the semiconductor wafers is compiled in Table 4.

TABLE 4

|  | Ramp I | Ramp II | Ramp III |
|---|---|---|---|
| Temperature reduction down to 1050° C. | 1° C./min | 1° C./min | 1° C./min |
| Temperature reduction down to 1000° C. | 2° C./min | 2° C./min | 2° C./min |
| Temperature reduction down to 900° C. | 3.5° C./min | 3.5° C./min | 3.5° C./min |
| Temperature reduction down to 800° C. | --- | 5° C./min | --- |
| Temperature reduction down to 500° C. | 5° C./min | 10° C./min | 5° C./min |
| Unloading temperature | 500° C. | 500° C. | 500° C. |

The semiconductor wafers subjected to thermal treatment were examined regarding the presence of BMDs.

Figure 11:
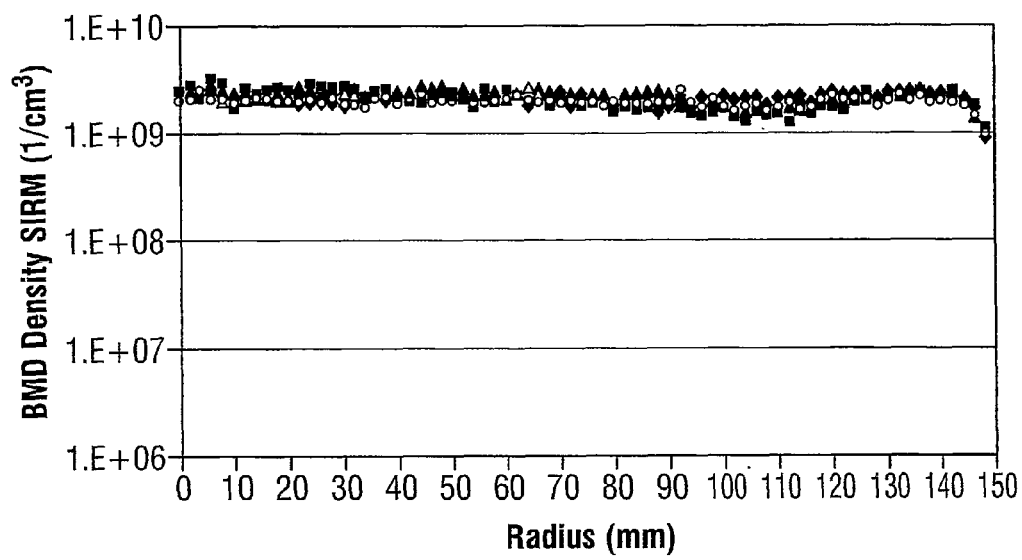
FIG. 11 is the BMD density after an anneal in accordance with the invention.

FIG. 11 shows the result after carrying out a BMD anneal and after evaluation with the aid of an SIRM-based BMD counter from Semilab, Hungary, in which case the semiconductor wafers had been subjected to thermal treatment in accordance with Ramp III. The tested semiconductor wafers originated from the middle third of the cylindrical section (ingot positions 400-460 mm). Accordingly, the BMD density in the case of the tested semiconductor wafers was at least $1\times10^9$ cm$^{-3}$ and the radial distribution of the BMD density fluctuated by less than 2.7 (BMD$_{max}$/BMD$_{min}$<2.7). The nitrogen concentration lay within the range of 8 to $15\times10^{13}$ atoms/cm$^3$ for all of the tested semiconductor wafers.

Figure 12:
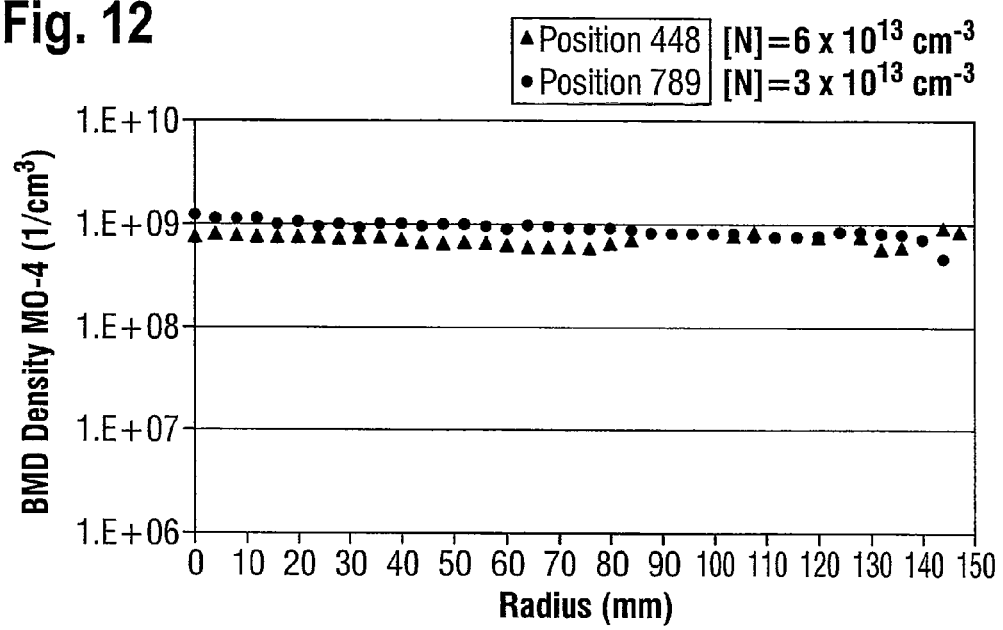
FIGS. 12-14 are BMD densities at different portions of an ingot grown in accordance with the invention and heat treated in accordance with the invention.

FIG. 12 shows the result after carrying out a BMD anneal on two semiconductor wafers with different ingot positions (in millimeters from the beginning of the ingot) and after evaluation with the aid of an IR-LST-based BMD counter of the MO-4 type, in which case the semiconductor wafers have been subjected to thermal treatment in accordance with Ramp II. Accordingly, the BMD density was at least $7\times10^8$ cm$^{-3}$ in the case of the tested semiconductor wafers and the radial distribution of the BMD density fluctuated by less than 2.8 (BMD$_{max}$/BMD$_{min}$<2.8). The nitrogen concentration lay within the range of 3 to $6\times10^{13}$ atoms/cm$^3$ for both semiconductor wafers.

Figure 13:
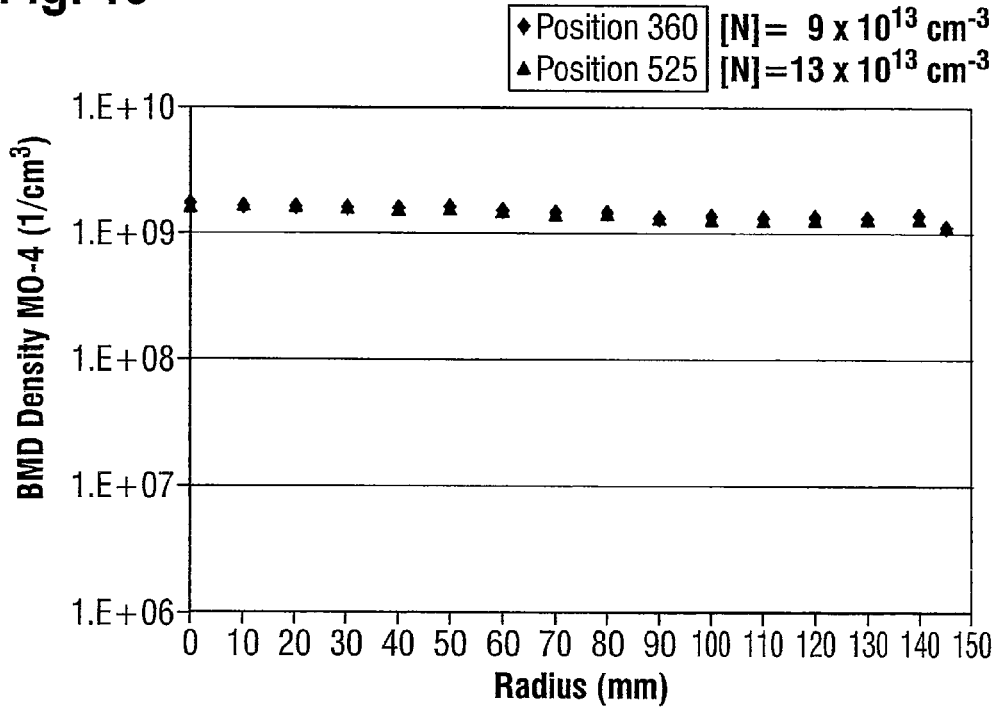

FIG. 13 shows the result after carrying out a BMD anneal on two semiconductor wafers with different ingot positions (in millimeters from the beginning of the ingot) and after evaluation with the aid of an IR-LST-based BMD counter of the MO-4 type, in which case the semiconductor wafers have been subjected to thermal treatment in accordance with Ramp I. Accordingly, the BMD density was at least $1\times10$ cm$^{-3}$ in the case of the tested semiconductor wafers and the radial distribution of the BMD density fluctuated by less than 2.4 (BMD$_{max}$/BMD$_{min}$<2.4). The nitrogen concentration lay within the range of 9 to $13\times10^{13}$ atoms/cm$^3$ for both semiconductor wafers.

Figure 14:
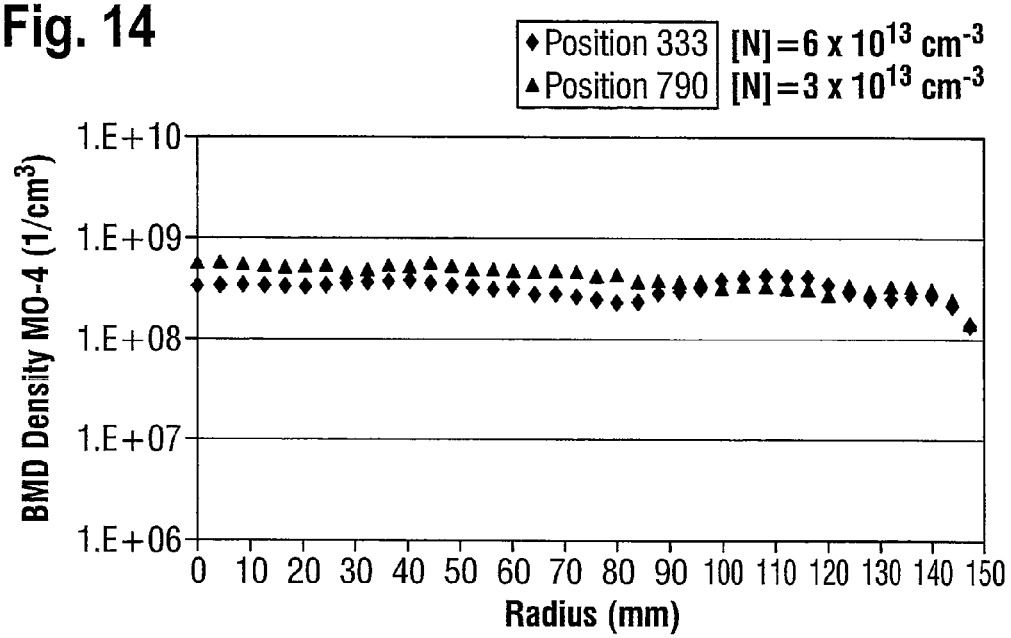

FIG. 14 shows the result of a direct evaluation without a preceding BMD anneal on two semiconductor wafers with different ingot positions (in millimeters from the beginning of the ingot), in which case the evaluation was effected with the aid of an IR-LST-based BMD counter of the MO-4 type and the semiconductor wafers had been subjected to thermal treatment in accordance with Ramp II. Accordingly, the BMD density was at least $3\times10^8$ cm$^{-3}$ in the case of the tested semiconductor wafers and the radial distribution of the BMD density fluctuated by less than 3.0 (BMD$_{max}$/BMD$_{min}$<3.0). The nitrogen concentration lay within the range of 3 to $6\times10^{13}$ atoms/cm$^3$ for both semiconductor wafers.

The thickness of the "denuded zone" (DZ) was furthermore determined. The result is compiled in Table 5.

TABLE 5

|  | Ramp I | Ramp II | Ramp III |
|---|---|---|---|
| Thickness of the DZ | 5-7 μm | 5-7 μm | 9-12 μm |

An OSF test was carried out on a further portion of the semiconductor wafers, to be precise, on those which had not yet experienced a thermal treatment (TT) and on those which had been subjected to a thermal treatment according to the invention. The OSFs were detected by optical microscopy after an oxidation in a moist atmosphere at 1050° C. for 4 hours and after a preparation by means of a Wright etch. During the optical microscopy, a measurement area of 0.1 cm$^2$ was evaluated every 5 mm from the center to the edge of the semiconductor wafer. The result of the OSF test is compiled in Table 6.

TABLE 6

| Test wafer | Axial position | OSF density before TT | OSF density after TT |
|---|---|---|---|
| 1 | 804 | 144.87 cm$^{-2}$ | — |
| 2 | 710 | 17.82 cm$^{-2}$ | — |
| 3 | 461 | 14.19 cm$^{-2}$ | — |
| 4 | 314 | 82.50 cm$^{-2}$ | — |

TABLE 6-continued

| Test wafer | Axial position | OSF density before TT | OSF density after TT |
|---|---|---|---|
| 5 | 801 | — | 3.63 cm$^{-2}$ |
| 6 | 711 | — | 1.65 cm$^{-2}$ |
| 7 | 460 | — | 0.33 cm$^{-2}$ |
| 8 | 317 | — | 0.33 cm$^{-2}$ |

Figure 15:
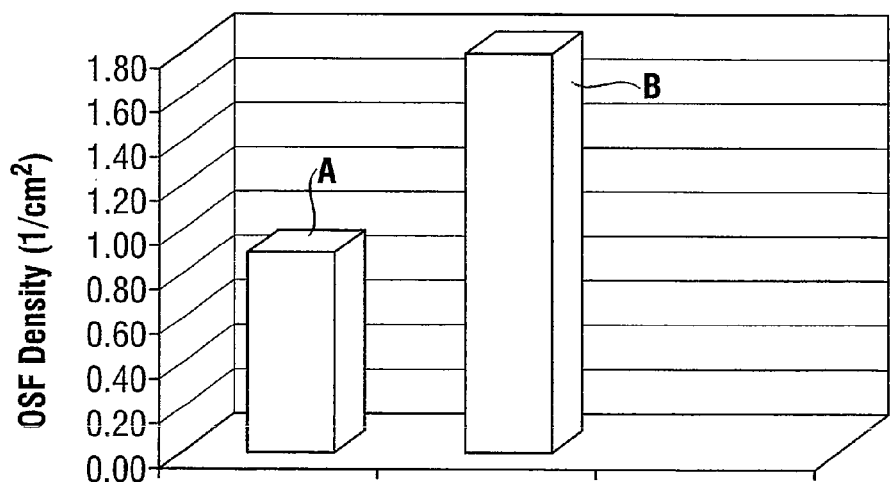
FIG. 15 illustrates the improvement in eliminating OSF nuclei by the inventive process.

The particular significance of the configuration of the thermal treatment for the purpose of eliminating OSF nuclei becomes apparent from FIG. 15. It shows that the extent of elimination of OSF nuclei depends in particular on the holding temperature and the holding duration. The elimination capability at a holding temperature of 1100° C. and a holding duration of 2 h, as provided in accordance with Ramp III (experiment A), was compared with a holding temperature apparently deviating only slightly therefrom, of 1050° C., and a holding duration of 4 h (experiment B). Accordingly, according to an OSF test, the OSF density in experiment A was approximately a factor of two lower than in experiment B and was constantly below 1 defect/cm². In comparative wafers which were not subjected to a thermal treatment, an OSF density of 63/cm² was uniformly found according to an OSF test.

Figure 16:
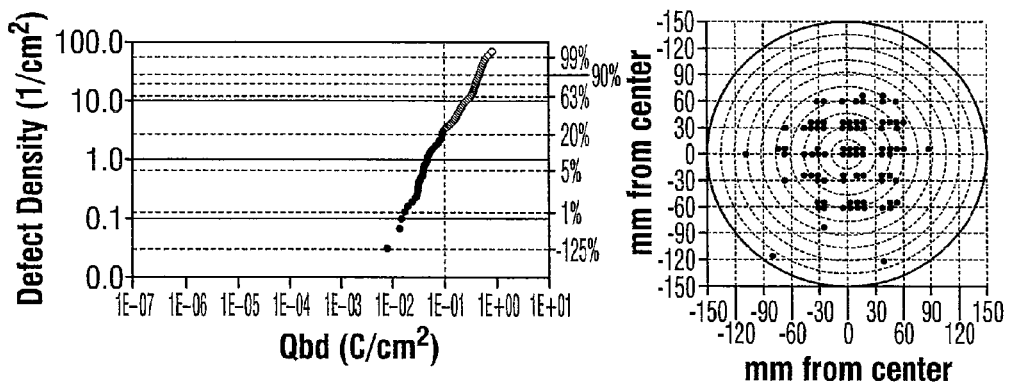
FIGS. 16 and 17 illustrates break down locations of test capacitors for wafers within the scope of the invention (FIG. 17) and wafers not processed according to the invention (FIG. 16).
Figure 17:
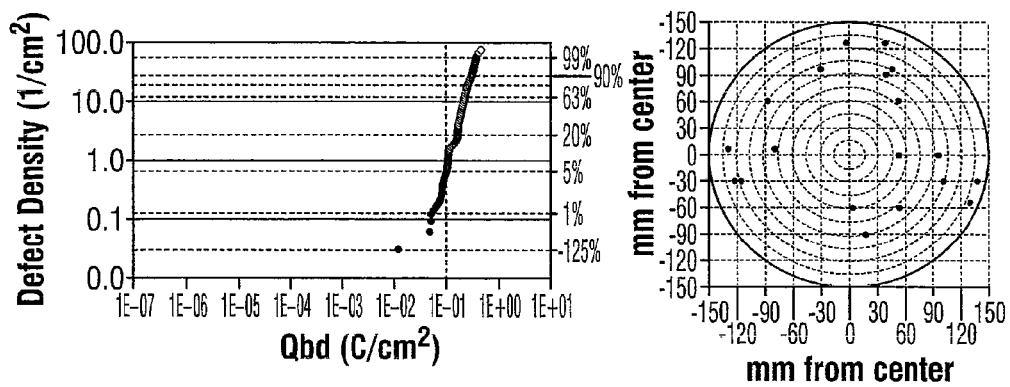

FIGS. 16 and 17 show, in a further comparison, how breakdown locations of test capacitors change as a result of the thermal treatment according to a GOI test with an oxide thickness of 5 nm. Semiconductor wafers from the last third of the cylindrical section of the single crystal were tested. While a semiconductor wafer not subjected to thermal treatment has a disk-shaped failure region in the center, which indicates the presence of OSF nuclei, the disk-shaped failure region is not present in the semiconductor wafer subjected to thermal treatment in accordance with the invention. The GOI test indicates the percentage failure of test capacitors for a rising charge quantity Qbd that flowed, and the number of defects per cm². A typical critical value emphasizes the failures which occurred up to a charge quantity of 0.1 C. The comparison shows a significant reduction of the failure rate owing to the elimination of OSF nuclei that accompanies the thermal treatment.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A semiconductor wafer having a front face, a rear face, and a bulk region therebetween, composed of monocrystalline silicon, containing oxygen at a concentration of from 4.4 to 5.2×10$^{17}$ atoms/cm³ and being doped with nitrogen, wherein the concentration of nitrogen is not less than 3×10$^{13}$ atoms/cm³ and not more than 2.5×10$^{14}$ atoms/cm³, comprising:
    an OSF region and a P$_v$ region, wherein the OSF region extends from the center of the semiconductor wafer radially toward the edge of the semiconductor wafer as far as the P$_v$ region;
    a BMD density in the bulk region of at least 3.5×10$^8$ cm$^{-3}$;
    a radial distribution of the BMD density with a fluctuation range expressed by the quotient BMD$_{max}$/BMD$_{min}$ of not more than 3, where BMD$_{max}$ and BMD$_{min}$ represent the maximum and minimum BMD density, respectively; and an OSF density of less than 10 cm$^{-2}$.

2. The semiconductor wafer of claim 1, characterized by a "denuded zone" on at least one face having a thickness of 5 to 25 μm.

3. A method for producing a semiconductor wafer having a front face, a rear face, and a bulk region therebetween, composed of monocrystalline silicon, doped with nitrogen, and comprising:
    an OSF region and a P$_v$ region, wherein the OSF region extends from the center of the semiconductor wafer radially toward the edge of the semiconductor wafer as far as the P$_v$ region;
    a BMD density in the bulk region of at least 3.5×10$^8$ cm$^{-3}$;
    a radial distribution of the BMD density with a fluctuation range expressed by the quotient BMD$_{max}$/BMD$_{min}$ of not more than 3, where BMD$_{max}$ and BMD$_{min}$ represent the maximum and minimum BMD density, respectively; and
    an OSF density of less than 10 cm$^{-2}$, the method comprising
    pulling a single crystal from a melt in accordance with the CZ method, and during pulling of the single crystal, controlling the quotient V/G of the pulling rate V and the axial temperature gradient G at the phase boundary such that an OSF region and a P$_v$ region are formed in a section of the single crystal that is provided for the production of semiconductor wafers, wherein the OSF region extends from the center of the single crystal radially toward the periphery of the single crystal as far as the P$_v$ region;
    during the pulling process, doping the single crystal with nitrogen such that the nitrogen concentration in a front part of the section of the single crystal that is provided for the production of semiconductor wafers is 3×10$^{13}$ to 6×10$^{13}$ atoms/cm³;
    during the pulling process, controlling the oxygen concentration such that the oxygen concentration in a section that is provided for the production of semiconductor wafers is 4.4 to 5.2×10$^{17}$ atoms/cm³;
    slicing semiconductor wafers composed of monocrystalline silicon from the single crystal;
    loading the semiconductor wafers composed of monocrystalline silicon into a furnace at a loading temperature of 500 to 750° C.;
    increasing the temperature of the semiconductor wafers composed of monocrystalline silicon from a loading temperature to a holding temperature at a rate of increase which is at least 3.5° C./min in a temperature range from the loading temperature to 1000° C. and which is less than 3.5° C./min in a temperature range from 1000° C. up to the holding temperature; and
    heat treating the semiconductor wafers composed of monocrystalline silicon at the holding temperature, in the range of 1075° C. to 1100° C. for a duration of not less than 45 minutes and not more than 180 minutes.

4. The method of claim 3, wherein, during the process of pulling the single crystal, a purge gas is conducted through a 10 mm to 20 mm gap between the surface of the melt and a ring of a gas guide tube.

5. The method of claim 3, wherein a CUSP magnetic field is impressed on the melt and the field strength of the CUSP magnetic field is increased during the process of pulling a rear part of the section of the single crystal that is provided for the production of semiconductor wafers.

6. The method of claim 4, wherein a CUSP magnetic field is impressed on the melt and the field strength of the CUSP magnetic field is increased during the process of pulling a rear part of the section of the single crystal that is provided for the production of semiconductor wafers.

7. The method of claim 3, wherein firstly a CUSP magnetic field and later a combination of a CUSP magnetic field and a travelling magnetic field directed upward are impressed on the melt.

8. The method of claim 4, wherein firstly a CUSP magnetic field and later a combination of a CUSP magnetic field and a travelling magnetic field directed upward are impressed on the melt.

9. The method of claim 3, wherein the rate of increase is about 5° C./min from the loading temperature up to a temperature of 900° C., and about 3.5° C./min from 900° C. up to the temperature of 1000° C.

10. The method of claim 4, wherein the rate of increase is about 5° C./min from the loading temperature up to a temperature of 900° C., and about 3.5° .C/min from 900° C. up to the temperature of 1000° C.

11. The method of claim 3, wherein the rate of increase is about 10° C./min from the loading temperature up to a temperature of 800° C., and about 5° C./min from 800° C. up to the temperature of 900° C., and about 3.5° C./min from 900° C. up to the temperature of 1000° C.

12. The method of claim 3, wherein the rate of increase is about 2° C./min from 1000° C. up to the temperature of 1050° C., and about 1° C./min from 1050° C. up to the holding temperature.

13. The method of claim 3, wherein the semiconductor wafers are cooled after the heat treating to an unloading temperature, at a cooling rate of not more than about 1° C./min down to a temperature of 1050° C., a cooling rate of not more than about 2° C./min from 1050° C. down to a temperature of 1000° C., a cooling rate of not more than about 3.5° C./min from 1000° C. down to a temperature of 900° C., a cooling rate of not more than about 5° C./min from 900° C. down to a temperature of 800° C., and a cooling rate of about 5 to about 10° C./min from 800° C. down to the unloading temperature.

14. The method of claim 4, wherein the semiconductor wafers are cooled after the heat treating to an unloading temperature, at a cooling rate of not more than about 1° C./min down to a temperature of 1050° C., a cooling rate of not more than about 2° C./min from 1050° C. down to a temperature of 1000° C., a cooling rate of not more than about 3.5° C./min from 1000° C. down to a temperature of 900° C., a cooling rate of not more than about 5° C./min from 900° C. down to a temperature of 800° C., and a cooling rate of about 5 to about 10° C./min from 800° C. down to the unloading temperature.

15. The method of claim 5, wherein the semiconductor wafers are cooled after the heat treating to an unloading temperature, at a cooling rate of not more than about 1° C./min down to a temperature of 1050° C., a cooling rate of not more than about 2° C./min from 1050° C. down to a temperature of 1000° C., a cooling rate of not more than about 3.5° C./min from 1000° C. down to a temperature of 900° C., a cooling rate of not more than about 5° C./min from 900° C. down to a temperature of 800° C., and a cooling rate of about 5 to about 10° C./min from 800° C. down to the unloading temperature.

16. The method of claim 7, wherein the semiconductor wafers are cooled after the heat treating to an unloading temperature, at a cooling rate of not more than about 1° C./min down to a temperature of 1050° C., a cooling rate of not more than about 2° C./min from 1050° C. down to a temperature of 1000° C., a cooling rate of not more than about 3.5° C./min from 1000° C. down to a temperature of 900° C., a cooling rate of not more than about 5° C./min from 900° C. down to a temperature of 800° C., and a cooling rate of about 5 to about 10° C./min from 800° C. down to the unloading temperature.

17. The method of claim 9, wherein the semiconductor wafers are cooled after the heat treating to an unloading temperature, at a cooling rate of not more than about 1° C./min down to a temperature of 1050° C., a cooling rate of not more than about 2° C./min from 1050° C. down to a temperature of 1000° C., a cooling rate of not more than about 3.5° C./min from 1000° C. down to a temperature of 900° C., a cooling rate of not more than about 5° C./min from 900° C. down to a temperature of 800° C., and a cooling rate of about 5 to about 10° C./min from 800° C. down to the unloading temperature.

* * * * *

UNITED STATES PATENT AND TRADEMARK OFFICE
CERTIFICATE OF CORRECTION

PATENT NO. : 8,398,766 B2
APPLICATION NO. : 12/548862
DATED : March 19, 2013
INVENTOR(S) : Timo Mueller et al.

It is certified that error appears in the above-identified patent and that said Letters Patent is hereby corrected as shown below:

In the Claims:

Column 15, Lines 36-37, Claim 13:

After "cooling rate of about":
Delete "5to" and
Insert -- 5 to --.

Signed and Sealed this
Twenty-third Day of July, 2013

Teresa Stanek Rea
*Acting Director of the United States Patent and Trademark Office*